(12) United States Patent
Zhang et al.

(10) Patent No.: US 10,784,077 B2
(45) Date of Patent: Sep. 22, 2020

(54) SYSTEMS AND METHODS FOR CHARGED PARTICLE FLOODING TO ENHANCE VOLTAGE CONTRAST DEFECT SIGNAL

(71) Applicant: ASML Netherlands B.V., AH Veldhoven (NL)

(72) Inventors: Frank Nan Zhang, San Jose, CA (US); Zhongwei Chen, San Jose, CA (US); Yixiang Wang, Fremont, CA (US); Ying Crystal Shen, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/053,636

(22) Filed: Aug. 2, 2018

(65) Prior Publication Data

US 2019/0043691 A1 Feb. 7, 2019

Related U.S. Application Data

(60) Provisional application No. 62/540,548, filed on Aug. 2, 2017, provisional application No. 62/550,613, filed on Aug. 26, 2017.

(51) Int. Cl.
*H01J 37/26* (2006.01)
*H01J 37/04* (2006.01)
*H01J 37/28* (2006.01)

(52) U.S. Cl.
CPC .......... *H01J 37/265* (2013.01); *H01J 37/045* (2013.01); *H01J 37/266* (2013.01); *H01J 37/28* (2013.01); *H01J 2237/0044* (2013.01); *H01J 2237/0048* (2013.01); *H01J 2237/049* (2013.01); *H01J 2237/0453* (2013.01);
(Continued)

(58) Field of Classification Search
USPC ........................................................ 250/307
See application file for complete search history.

(56) References Cited

U.S. PATENT DOCUMENTS 4,263,514 A * 4/1981 Reeds, Jr. ........... H01J 37/3007
250/398
4,687,940 A 8/1987 Ward et al.
(Continued)

FOREIGN PATENT DOCUMENTS

CN 101499433 A 2/2013
EP 3 166 127 A1 5/2017
(Continued)

OTHER PUBLICATIONS

Office Action and Search Report issued from the Intellectual Property Office of ROC Taiwan Patent Application No. 107126318, dated Dec. 28, 2018.
(Continued)

*Primary Examiner* — Phillip A Johnston
(74) *Attorney, Agent, or Firm* — Finnegan, Henderson, Farabow, Garrett & Dunner LLP

(57) ABSTRACT

Systems and methods for implementing charged particle flooding in a charged particle beam apparatus are disclosed. According to certain embodiments, a charged particle beam system includes a charged particle source and a controller which controls the charged particle beam system to emit a charged particle beam in a first mode where the beam is defocused and a second mode where the beam is focused on a surface of a sample.

19 Claims, 10 Drawing Sheets

(52) U.S. Cl.
CPC ............... *H01J 2237/0455* (2013.01); *H01J 2237/0458* (2013.01); *H01J 2237/28* (2013.01); *H01J 2237/2817* (2013.01)

(56) References Cited

U.S. PATENT DOCUMENTS

| | | | |
|---|---|---|---|
| 5,466,904 A * | 11/1995 | Pfeiffer | B82Y 10/00 219/121.25 |
| 5,506,414 A * | 4/1996 | Coxon | H01J 37/06 250/305 |
| 6,930,309 B1 | 8/2005 | Mankos et al. | |
| 7,067,821 B2 * | 6/2006 | Barnard | H01J 37/026 250/251 |
| 7,253,410 B1 | 8/2007 | Bertsche et al. | |
| 8,748,815 B2 | 6/2014 | Zhao et al. | |
| 8,759,762 B2 | 6/2014 | Xiao et al. | |
| 9,184,024 B2 | 11/2015 | Chen | |
| 9,859,092 B2 * | 1/2018 | Preikszas | H01J 37/21 |
| 2009/0114817 A1 | 5/2009 | Bullock | |
| 2011/0272576 A1 | 11/2011 | Otaki et al. | |

FOREIGN PATENT DOCUMENTS

| | | |
|---|---|---|
| TW | I389232 B1 | 3/2013 |
| TW | 201618151 A | 5/2016 |

OTHER PUBLICATIONS

International Search Report and Written Opinion and Transmittal of same, dated Oct. 29, 2018, issued in the counterpart International Patent Application Np. PCT/EP2018/069524.

Office Action issued from the Intellectual Property Office of ROC Taiwan Patent Application No. 107126318, dated May 29, 2019 (19 pgs.) (Chinese and English-language attached).

* cited by examiner

SYSTEMS AND METHODS FOR CHARGED PARTICLE FLOODING TO ENHANCE VOLTAGE CONTRAST DEFECT SIGNAL

RELATED APPLICATIONS

This application claims the benefit of priority of U.S. Provisional Application No. 62/540,548, filed on Aug. 2, 2017, and U.S. Provisional Application No. 62/550,613, filed on Aug. 26, 2017, both of which are herein incorporated by reference in their entireties.

TECHNICAL FIELD

The present disclosure generally relates to the field of charged particle beam apparatuses, and more particularly, to systems and methods for implementing charged particle flooding in a charged particle beam apparatus.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to sub-100 or even sub-10 nanometers, inspection systems capable of higher resolution than those utilizing optical microscopes are needed. In addition, electrical defects on wafers, such as open contact failure, open/short wiring failure, etc. cannot be detected by optical inspection.

A charged particle (e.g., electron) beam microscope, such as a scanning electron microscope (SEM), capable of resolution down to less than a nanometer, serves as a practical tool for inspecting IC components on wafers having a feature size in the sub-100 nanometer domain. With an SEM, electrons of a primary electron beam (e-beam) can be focused at probe spots of a wafer under inspection. The interactions of the primary electrons with the wafer can result in one or more secondary electron beams. The secondary electron beams may comprise backscattered electrons, secondary electrons, or Auger electrons, resulting from the interactions of the primary electrons with the wafer. The intensity of the one or more secondary electron beams can vary based on the properties of the internal or external structures of the wafer, and thus indicates whether the wafer includes defects.

The intensity of the secondary electron beams can be determined using a detection device or detector. The secondary electron beams can form one or more beam spots at pre-determined locations on a surface of the detector. The detector can generate electrical signals (e.g., a current, a voltage, etc.) that represent an intensity of the detected secondary electron beams. The electrical signals can be measured with measurement circuitries (e.g., analog-to-digital converters) to obtain a distribution of the detected electrons. The electron distribution data collected during a detection time window, in combination with corresponding scan path data of the primary electron beam incident on the wafer surface, can be used to reconstruct images of the wafer structures under inspection. The reconstructed images can be used to reveal various features of the internal or external structures of the wafer, and can be used to reveal any defects that may exist in the wafer.

Moreover, physical and electrical defects on a wafer can be detected using a voltage contrast method of a charged particle inspection system. To detect voltage contrast defects, typically a process called pre-charging is employed in which charged particles are applied onto an area to be inspected before conducting the inspection. Benefits of pre-charging include: 1) reducing the charging on the wafer surface which would cause defocusing and distortion or images; and 2) the ability to apply a proper voltage on features of the wafer so that defective and surrounding non-defective features behave differently under inspection. Also, pre-charging enhances the voltage contrast signal of the defects so that a satisfactory signal to noise ratio (SNR) can be obtained and defects will be easily detected in a charged particle inspection system.

Currently, dedicated e-beam flood guns have been adopted as useful tools to pre-charge a wafer surface and set the charging conditions. A dedicated e-beam flood gun can enhance the voltage contrast defect signal, so as to increase the defect detection sensitivity or throughput. In a flooding procedure, a flood gun is used to provide a relatively large amount of electrons to charge a predefined area. Afterwards, the primary electron source of an e-beam inspection system is applied to scan an area within the pre-charged area to achieve imaging of the area.

While a traditional flood gun may be capable of generating a large charged particle current and can achieve flooding of a whole wafer in a short time, a traditional flood gun faces drawbacks in the application of charged particle beam inspection. For example, in charged particle beam inspection of small memory devices, advantages of a traditional flood gun are negated due to the small area to be inspected. Flood guns also face limitations due to their independency from the charged particle source of the inspection system. Furthermore, it is necessary for the system to switch between two different working modes, one for flooding and one for inspection. Since both working modes are in high voltage conditions, turning one on and the other off costs time and introduces system design complexities.

Furthermore, traditional flood guns are normally limited by cost restraints and by virtue of being a sub-component subordinate to other sub-systems in an e-beam inspection system. Thus, traditional flood guns have much more simplified controls compared to, for example, an SEM's primary beam system. Accordingly, a flood gun has limited controllability and low accuracy. Additionally, attempting to address such limitations by making improvements to the dedicated flood gun to have more precise controllability may be impractically expensive. Moreover, packaging constraints restrict the amount of modification that is possible to a dedicated flood gun occupying a space in a charged particle beam inspection system.

The information disclosed in this Background section is only for enhancement of understanding of the background of the present disclosure and should not be taken as an acknowledgement or any form of suggestion that this information forms the prior art that is already known to a person skilled in the art. For example, the above limitations and drawbacks of the related art are considered to be matters that have been addressed by the inventors to derive the present inventive concept, or as matters discovered during the course of conceiving the present disclosure. Thus, the descriptions above may not simply be referred to as information which was known to the general public prior to filing the present application.

SUMMARY

Embodiments of the present disclosure provide systems and methods for providing a charged particle flooding mode while providing an inspection mode in a charged particle beam inspection apparatus.

In some embodiments, a charged particle beam system is provided having a charged particle source configured to emit a charged particle beam along an optical axis, at least one aperture configured to allow the charged particle beam to pass through, and a controller. The controller may be configured to control the charged particle beam system to emit the charged particle beam in a first mode where the charged particle beam is incident on a sample at a first current level and is defocused. The controller may be further configured to control the charged particle beam system to emit the charged particle beam in a second mode where the charged particle beam is incident on the sample at a second current level and is focused to a surface of the sample. The controller may also be configured to switch the charged particle beam system between the first mode and the second mode.

In some embodiments, a method of inspecting a sample using a charged particle beam system is provided. The method may comprise emitting a charged particle beam incident on the sample at a first current level, where the charged particle beam is defocused on a surface of the sample. The method may further comprise emitting a charged particle beam incident on the sample at a second current level, where the charged particle beam is focused on the surface of the sample.

Additional objects and advantages of the disclosed embodiments will be set forth in part in the following description, and in part will be apparent from the description, or may be learned by practice of the embodiments. Objects and advantages of the disclosed embodiments may be realized and attained by the elements and combinations set forth in the claims. However, exemplary embodiments of the present disclosure are not necessarily required to achieve such exemplary objects and advantages, and some embodiments may not achieve any of the stated objects and advantages.

It is to be understood that both the foregoing general description and the following detailed description are exemplary and explanatory only and are not restrictive of the disclosed subject matter, as claimed.

DESCRIPTION OF EXAMPLE EMBODIMENTS

Figure 1:
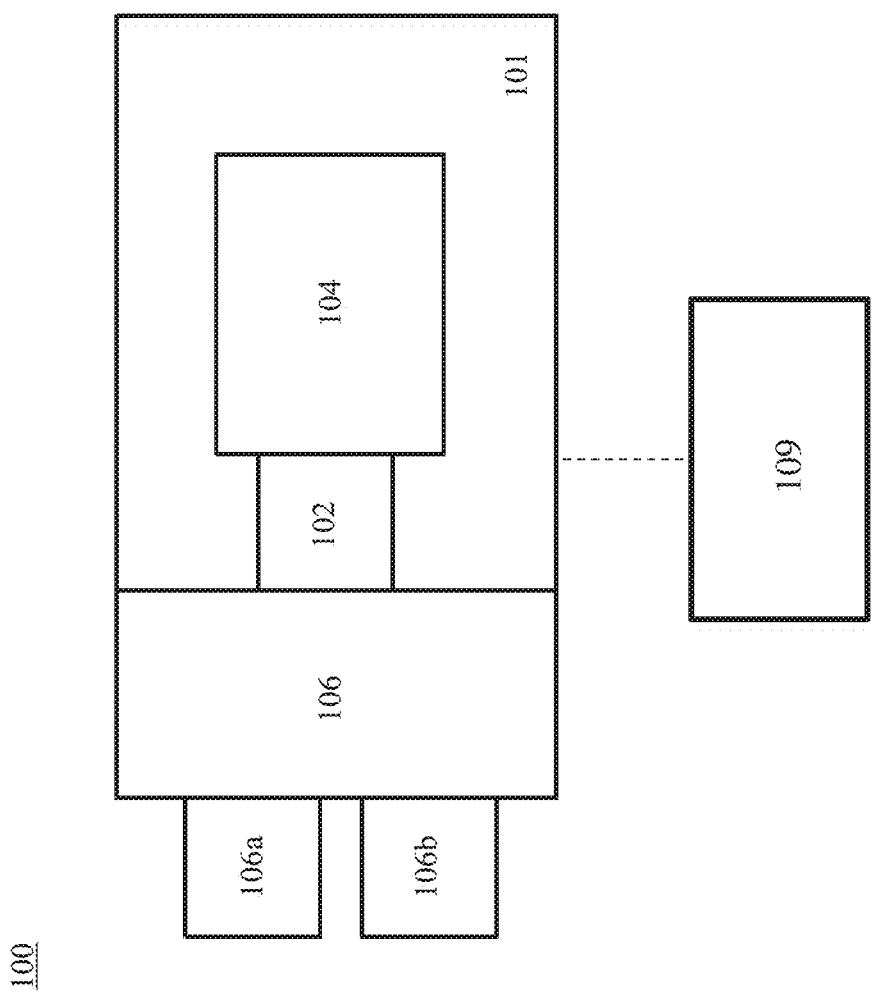
FIG. 1 is a schematic diagram illustrating an exemplary electron beam inspection (EBI) system, consistent with embodiments of the present disclosure.

Various example embodiments of the present disclosure will now be described more fully with reference to the accompanying drawings in which some example embodiments of the invention are shown. Without limiting the scope of the protection of the present invention, all the description and drawings of embodiments will exemplarily refer to an electron beam.

Detailed illustrative embodiments of the present disclosure are disclosed herein. However, specific structural and functional details disclosed herein are merely representative for purposes of describing example embodiments of the present disclosure. This invention may, however, may be embodied in many alternate forms and should not be construed as limited to only the explicitly stated embodiments set forth herein.

Accordingly, while example embodiments of the disclosure are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

While several exemplary ranges of values are discussed herein, it is to be appreciated that such ranges are merely examples. Certain embodiments consistent with the present disclosure may be operable outside such ranges.

In the present disclosure, axial can indicate in the optical axis direction of an apparatus, while radial can indicate in a direction perpendicular to the optical axis. The X and Y axes of a coordinate system shall be understood to mean two perpendicular directions in the plane of a wafer.

The conjunctive term "or" includes any and all combinations of one or more listed elements associated by the conjunctive term. For example, the phrase "an apparatus comprising A or B" may refer to an apparatus including A where B is not present, an apparatus including B where A is not present, or an apparatus where both A and B are present. The phrases "at least one of A, B, . . . and N" or "at least one of A, B, . . . N, or combinations thereof" are defined in the broadest sense to mean one or more elements selected from the group comprising A, B, . . . , and N, that is to say, any combination of one or more of the elements A, B, . . . , or N including any one element alone or in combination with one or more of the other elements which may also include, in combination, additional elements not listed.

In an exemplary method, an electron beam is used to flood the surface of a wafer being inspected in an SEM tool. Flooding can be used to enhance the voltage contrast signal of defects to a satisfactory signal to noise ratio (SNR) level, so that defects can be easily caught in a SEM inspection process.

In an exemplary embodiment, the SEM tool's primary electron beam is used to replace a discrete flood gun in a system to flood the wafer surface. The flooding can be used for pre-charging the wafer in preparation for inspecting the wafer by the SEM tool. Pre-charging may be useful to enhance voltage contrast type defect signals, for example as discussed in U.S. Pat. Nos. 8,748,815 and 8,759,762, both of which are herein incorporated by reference in their entireties.

Briefly, pre-charging may be implemented in various schemes, including pre-scanning, defocused pre-scanning, and flooding. For example, pre-scanning may be used. In pre-scanning, the same current settings, among other conditions, as those used in imaging are used to pre-scan an area. During pre-scanning, however, image data is disregarded while the beam scans a region until image scanning begins and the imaging signal is collected.

Additionally, defocused pre-scanning may be used. In defocused pre-scanning, the same current settings may be used as those used in imaging. During pre-scanning, the beam is defocused. Since the beam is defocused, current density incident on the sample is reduced, which allows a slightly larger overall current beam to be used. Therefore, defocused pre-scanning may be more effective than non-defocused pre-scanning. While a slightly larger current beam can be used, current level may still be limited due to current requirements for imaging.

Also, flooding may be used. Flooding allows for a relatively large area to be pre-charged, which may have better efficiency in some applications.

In an exemplary embodiment of the present disclosure, there is provided an e-beam source equipped with an adjustable aperture, such as a set of apertures in front (towards the direction of electron beam radiated) of the e-beam source tip. The set of apertures can comprise at least one or more aperture holes used to regulate the needed beam current (the dosage) for the flooding function.

In an exemplary embodiment of the present disclosure, a method is provided for using the SEM's native electron optics combining a condenser lens and an objective lens to form the needed beam spot size for flooding. The SEM's primary beam may be used for both imaging and flooding.

The e-beam dosage can be regulated by selecting the desired aperture. The current range can be set to several levels within the maximum available beam current being that which the e-beam source is able to provide (such as in the µA range). That is, the current of the e-beam applied to the wafer can be adjusted by selecting a corresponding aperture. For example, an aperture configured to emit a beam on the order of 1 µA may be used for e-beam flooding. An aperture configured to emit a beam in a range of 0.1 to 200 nA may be used for inspection. The range of possible emission current used in either mode permits a high level of adjustability. It is possible that current ranges used for flooding overlap with current ranges used for inspection. Thus, in some embodiments, the largest inspection current may be larger than the smallest flooding current. For example, the flooding current range may be set to be 80 to 1500 nA.

The beam spot size can be, but is not limited to, the range of sub-micron to millimeter ($10^{-4}$ to $10^{0}$ mm). In some embodiments, the range of beam spot sizes made available by the adjustable aperture can be from 5 µm to 1 mm. The beam having an appropriate spot size can then be used to flood the wafer surface.

A larger beam spot size is useful to reduce the current density of the e-beam applied to the wafer. For example, with a typical flood gun configured to emit a beam of 100 µA, a spot size of the beam will be made very large. However, in an e-beam inspection tool such as a SEM tool, the field of view (FOV) is limited, so there is no need to flood a large area of the wafer. Furthermore, it may be advantageous to allow for adjustability to provide a smaller spot size for more precise charging control. That is, a spot size that is ideal for generating proper charging conditions for some inspection applications may be selected, and thus a wafer can be treated more efficiently while avoiding charging of areas outside the inspection area.

Depending on the application needs, the setting of the e-beam source aperture can be combined with the setting of the column aperture to form the optimized flooding beam current density with the shortest switching time.

Reference is now made to FIG. 1, which illustrates an exemplary electron beam inspection (EBI) system 100 consistent with embodiments of the present disclosure. As shown in FIG. 1, EBI system 100 includes a main chamber 101, a load/lock chamber 102, an electron beam tool 104, and an equipment front end module (EFEM) 106. Electron beam tool 104 is located within main chamber 101. Electron beam tool 104 may be a single-beam system or a multi-beam system. A controller 109 is electronically connected to the electron beam tool 104. The controller 109 may be a computer configured to execute various controls of the EBI system.

EFEM 106 includes a first loading port 106a and a second loading port 106b. EFEM 106 may include additional loading port(s). First loading port 106a and second loading port 106b can receive wafer front opening unified pods (FOUPs) that contain wafers (e.g., semiconductor wafers or wafers made of other material(s)) or samples to be inspected (wafers and samples are collectively referred to as "wafers" hereafter). One or more robotic arms (not shown) in EFEM 106 can transport the wafers to load/lock chamber 102.

Load/lock chamber 102 is connected to a load/lock vacuum pump system (not shown), which removes gas molecules in load/lock chamber 102 to reach a first pressure below the atmospheric pressure. After reaching the first pressure, one or more robotic arms (not shown) can transport the wafer from load/lock chamber 102 to main chamber 101. Main chamber 101 is connected to a main chamber vacuum pump system (not shown), which removes gas molecules in main chamber 101 to reach a second pressure below the first pressure. After reaching the second pressure, the wafer is subject to flooding or inspection by electron beam tool 104.

Figure 2:
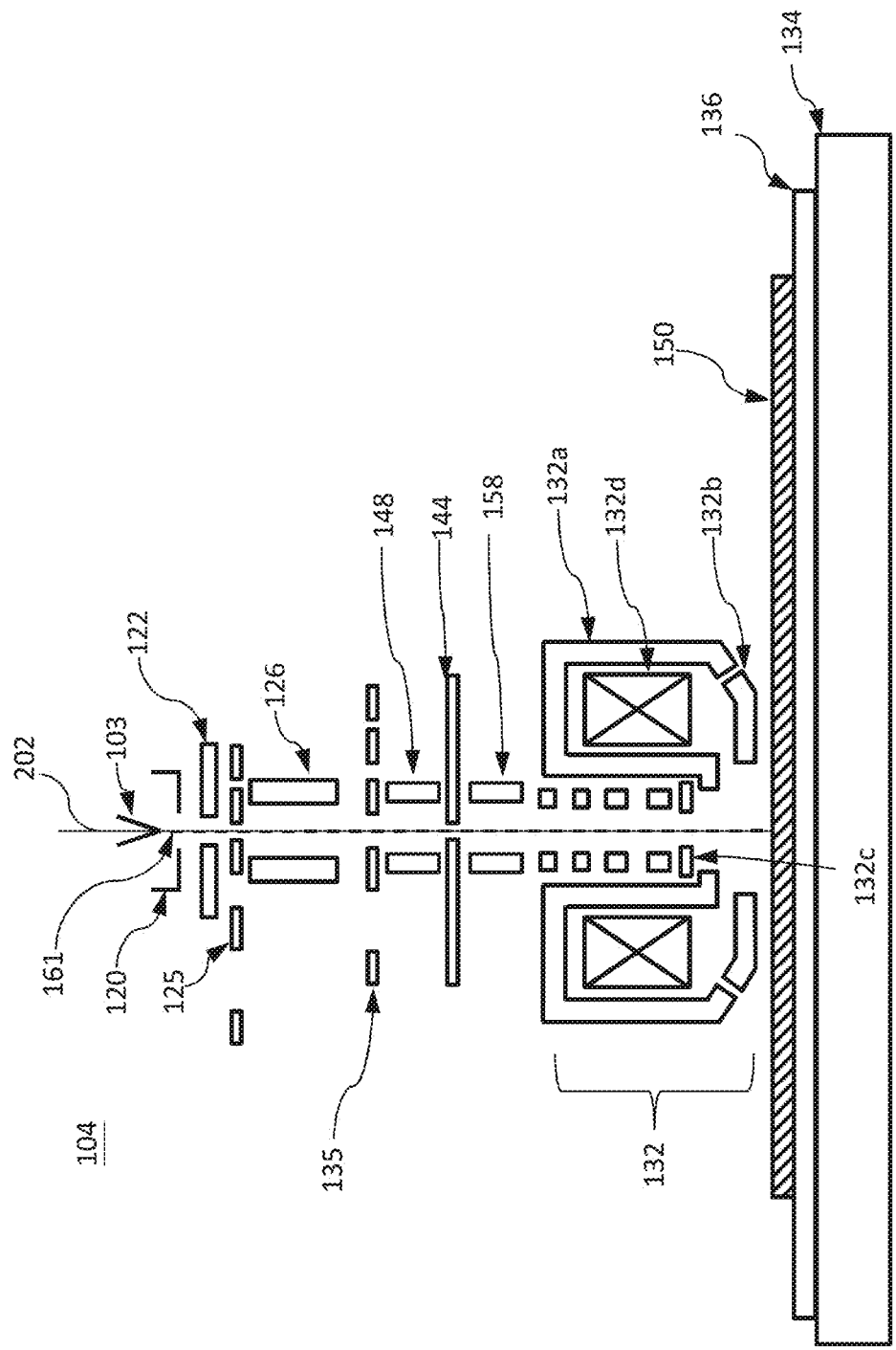
FIG. 2 is a schematic diagram illustrating an exemplary single-beam electron beam tool, consistent with embodiments of the present disclosure that can be a part of the exemplary electron beam inspection system of FIG. 1.

FIG. 2 illustrates a single beam apparatus in which an inspection system comprises a single primary beam configured to generate a secondary beam. A detector may be placed along an optical axis, as in the embodiment shown in FIG. 2. In some embodiments, a detector may be arranged off axis.

As shown in FIG. 2, an electron beam tool 104 includes a wafer holder 136 supported by motorized stage 134 to hold a wafer 150 to be inspected. Electron beam tool 104 includes an electron emitter, which may comprise a cathode 103, an anode 120, and a gun aperture 122. Electron beam tool 104 further includes a beam limit aperture 125, a condenser lens 126, a column aperture 135, an objective lens assembly 132, and an electron detector 144. Objective lens assembly 132, in some embodiments, is a modified SORIL lens, which includes a pole piece 132a, a control electrode 132b, a deflector 132c, and an exciting coil 132d. In a general imaging process, the electron beam 161 emanating from the tip of the cathode 103 is accelerated by anode 120 voltage, passes through gun aperture 122, beam limit aperture 125, condenser lens 126, and is focused into a probe spot by the modified SORIL lens and then impinges onto the surface of the wafer 150. Secondary electrons emanated from the wafer surface are collected by detector 144 to form an image of the interest area.

The condenser and illumination optics of the electron beam tool may comprise or be supplemented by electromagnetic quadrupole electron lenses. For example, as shown in FIG. 2, the electron beam tool 104 comprises a first quadrupole lens 148 and a second quadrupole lens 158. In some embodiments, the quadrupole lenses are used for controlling the electron beam. For example, first quadrupole lens 148 can be controlled to adjust the beam current and second quadrupole lens 158 can be controlled to adjust the beam spot size and beam shape.

Although FIG. 2 shows electron beam tool 104 as a single-beam inspection tool that uses only one primary electron beam to scan one location of wafer 150 at a time, electron beam tool 104 may also be a multi-beam inspection tool that employs multiple primary electron beamlets to simultaneously scan multiple locations on wafer 150.

Figure 3:
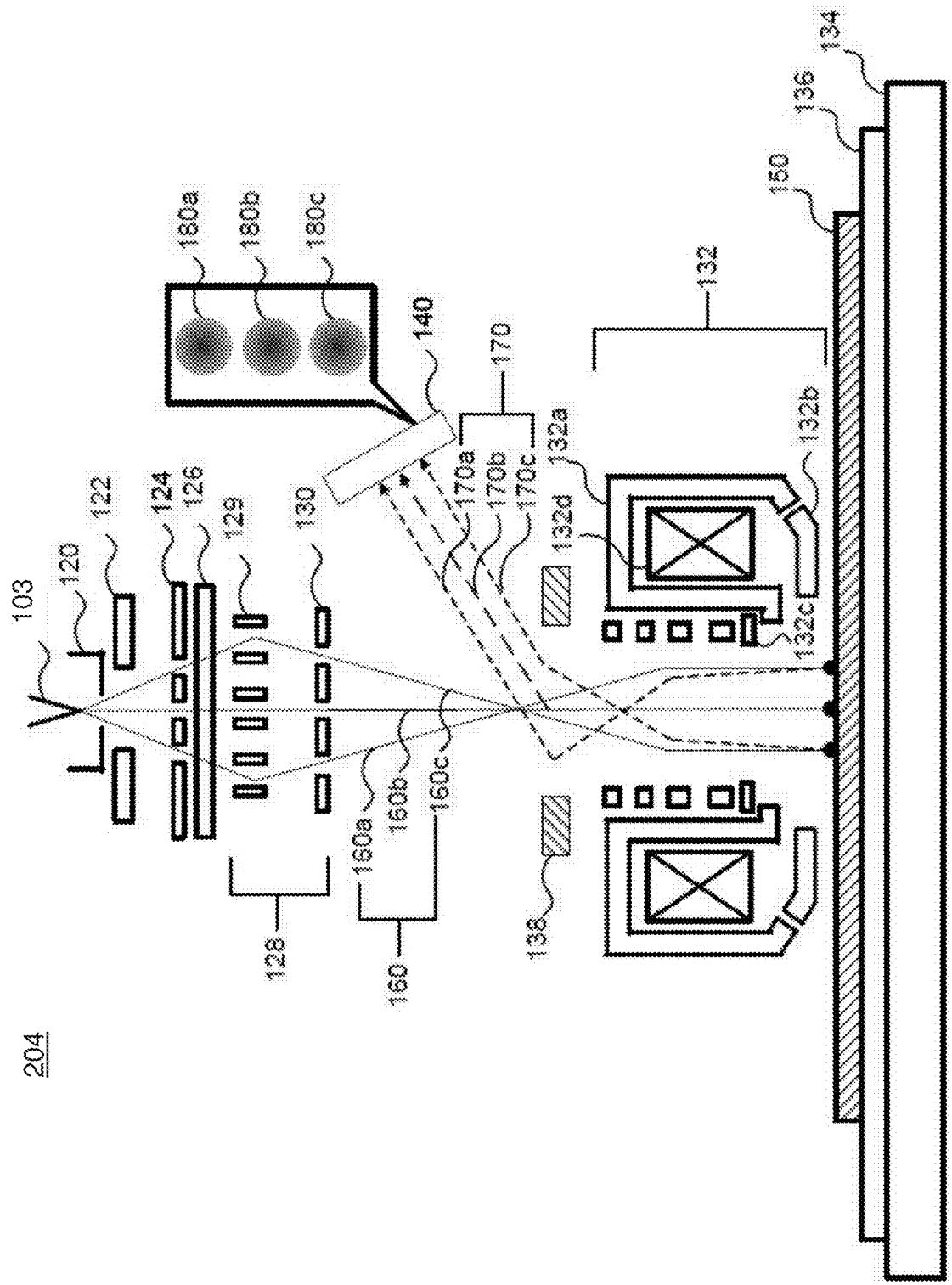
FIG. 3 is a schematic diagram illustrating an exemplary multi-beam electron beam tool, consistent with embodiments of the present disclosure that can be a part of the exemplary electron beam inspection system of FIG. 1.

For example, FIG. 3 illustrates a multi-beam apparatus for directing multiple beams of a primary beam source onto a sample by use of a beam separator. It will be readily appreciated that embodiments of the present disclosure can be applied to a single-beam apparatus as well.

As shown in FIG. 3, electron beam tool 204 includes a motorized stage 134 and a wafer holder 136 supported by motorized stage 134 to hold a wafer 150 to be inspected. Electron beam tool 204 includes an electron emitter which may comprise a cathode 103, an anode 120, and a gun aperture 122. Electron beam tool 204 further includes a beam limit aperture 124, a condenser lens 126, a source conversion unit 128, an objective lens assembly 132, a beam separator 138, and an electron detector 140. Source conversion unit 128, in some embodiments, can include a micro-deflector array 129 and a beamlet-limit plate 130. Objective lens assembly 132, in one embodiment, can include a modified swing objective retarding immersion lens (SORIL), which includes a pole piece 132a, a control electrode 132b, a deflector 132c, and an exciting coil 132d. Electron beam tool 204 may additionally include an energy dispersive X-ray spectrometer (EDS) detector (not shown) to characterize the materials on the wafer.

When electron beam tool 204 operates, a wafer 150 to be inspected is mounted or placed on wafer holder 136, which is supported by motorized stage 134. A voltage is applied between anode 120 and cathode 103, and cathode 103 emits an electron beam 160. The emitted electron beam passes through gun aperture 122 and beam limit aperture 124, both of which can determine the size of electron beam entering condenser lens 126, which resides below beam limit aperture 124. Condenser lens 126 can focus the emitted electron beam 160 before electron beam 160 enters source conversion unit 128. Micro-deflector array 129 can split the emitted beam into multiple primary electron beams 160a, 160b, and 160c. The number of multiple primary beams is not limited to three, and micro-deflector array 129 can be configured to split the emitted beam into greater number of primary electron beams. Beamlet-limit plate 130 can set the size of the multiple primary electron beams before entering objective lens assembly 132. Deflector 132c deflects the primary electron beams 160a, 160b, and 160c to facilitate beam scanning on the wafer. For example, in a scanning process, deflector 132c can be controlled to deflect primary electron beams 160a, 160b, and 160c simultaneously onto different locations of top surface of wafer 150 at different time points, to provide data for image reconstruction for different parts of wafer 150.

In the objective lens assembly 132, exciting coil 132d and pole piece 132a generate a magnetic field that begins at one end of pole piece 132a and terminates at the other end of pole piece 132a. A part of wafer 150 being scanned by primary electron beam 160 can be immersed in the magnetic field and can be electrically charged, which, in turn, creates an electric field. The electric field reduces the energy of impinging primary electron beam 160 near the surface of the wafer before it collides with the wafer. Control electrode 132b, being electrically isolated from pole piece 132a, controls an electric field on the wafer to prevent micro-arching of the wafer and to ensure proper beam focus.

Backscattered primary electrons and secondary electrons can be emitted from the part of wafer 150 upon receiving primary electron beams 160a, 160b, and 160c. Beam separator 138 can direct the secondary or scattered electron beams 170a, 170b, and 170c, comprising backscattered and secondary electrons, to a sensor surface of electron detector 140. The detected electron beams 170a, 170b, and 170c can form corresponding beam spots 180a, 180b, and 180c on the sensor surface of electron detector 140. Electron detector 140 can generate signals (e.g., voltages, currents, etc.) that represent the intensities of the received beam spots, and provide the signals to a processing system, such as controller 109. The intensity of secondary or scattered electron beams 170a, 170b, and 170c, and the resultant beam spots, can vary according to the external or internal structure of wafer 150. Moreover, as discussed above, primary electron beams 160a, 160b, and 160c can be projected onto different locations of the top surface of wafer 150 to generate secondary or scattered electron beams 170a, 170b, and 170c (and the resultant beam spots) of different intensities. Therefore, by mapping the intensities of the beam spots with the locations of wafer 150, the processing system can reconstruct an image that reflects the internal or external structures of wafer 150

Furthermore, electron beam tool 104 may be part of a multiple column aperture SEM system. Moreover, electron beam tool 104 may also be implemented as an electron-beam lithography (EBL) system, such as an electron-beam direct write (EBDW) system. The present application does not limit the specific system or technology area where the disclosed charged particle emitter is applied. Thus, the present disclosure may be applicable to any charged particle system, such as a FIB (focused ion beam) system, AFM (atomic force microscopy) system, or other electron beam systems such as SEM e-beam inspection systems.

Figure 4:
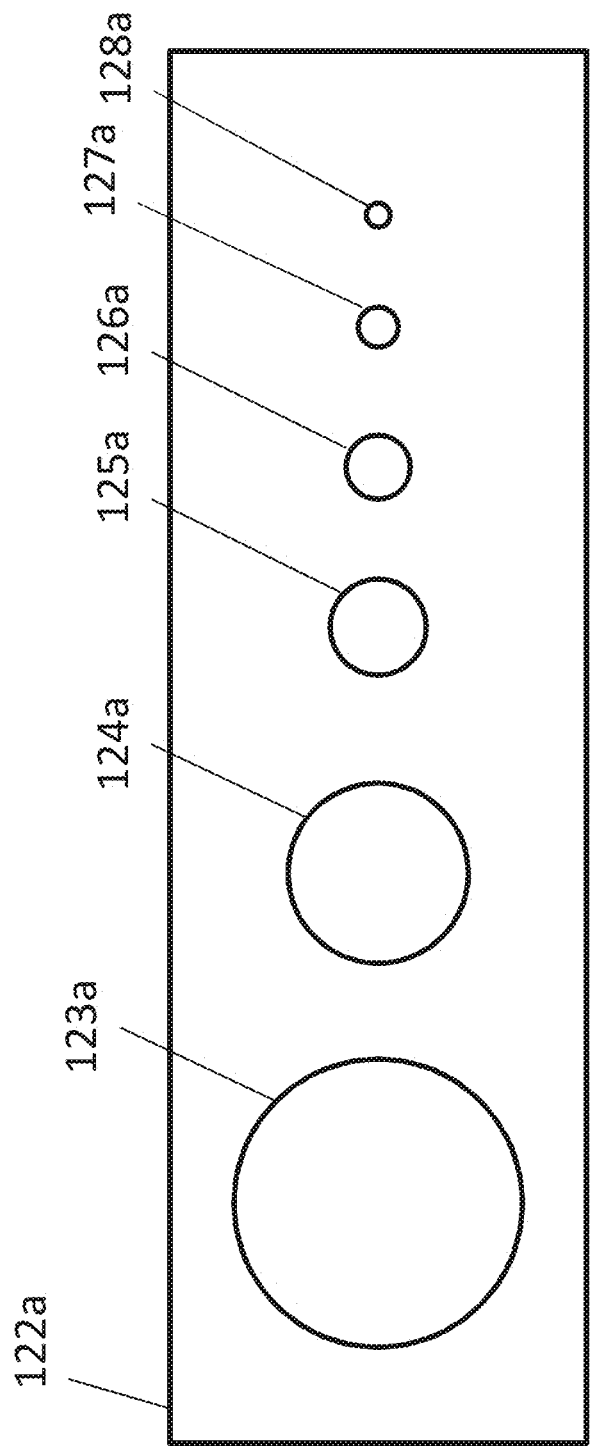
FIG. 4 is a schematic diagram illustrating an exemplary selectively changeable aperture, consistent with embodiments of the present disclosure.

Reference is now made to FIG. 4, which illustrates exemplary components of a selectively changeable aperture plate 122a consistent with embodiments of the present disclosure. The selectively changeable aperture plate 122a may be provided in place of or in addition to gun aperture 122. Furthermore, the beam limit aperture 125 and column aperture 135 may be provided as selectively changeable apertures.

As shown in FIG. 4, a selectively changeable aperture plate 122a may be a plate comprising a plurality of holes. For example, the selectively changeable aperture plate 122a includes a first aperture hole 123a, a second aperture hole 124a, a third aperture hole 125a, and so on. The first aperture hole 123a has a diameter configured to allow an electron beam to pass therethrough and can be configured to produce a relatively large spot size for flooding. The selectively changeable aperture plate 122a may comprise a plurality of further progressively smaller aperture holes for flooding a smaller area or which are appropriate for use in performing e-beam inspection. The number of holes in the aperture plate is customizable.

Since the electrons emitted from the e-beam source may have a uniform angle density, the current passing through the aperture is directly related to the aperture hole size. When one selectively changeable aperture plate is arranged between an e-beam source and an area to be irradiated, the aperture plate can be configured to pass electron current of, for example, 150 nA, 300 nA, 600 nA, and 1,200 nA using four different sized aperture holes. The current level specified by the aperture may determine the level of current incident on the sample. When multiple apertures are arranged in series in the optical axis direction, current level can be trimmed down successively, such that the multiple apertures each have an effect on the ultimate current incident on the sample.

In some embodiments, the first aperture hole 125a may have a diameter in a range of, for example, 100 to 200 μm. The aperture plate 122a may be provided with another hole having a diameter of, for example, 60 μm which is used for inspection mode. In inspection mode, it is advantageous for the electron beam to be focused to a point. For example, the point-focused probe spot may be on the order of 1 nm. A narrowly focused probe spot is advantageous to achieve high imaging resolution.

The selectively changeable aperture plate 122a may be positioned between the electron emitter and the wafer in an electron beam tool. In some embodiments, the selectively changeable aperture plate 122a may be positioned between the electron emitter and the condenser lens of an electron beam tool.

Material of the selectively changeable aperture plate 122a is or can comprise a non-magnetic, conductive plate, such as one or more of platinum, gold, molybdenum, copper, tantalum, platinum-iridium (95:5), graphite, or others.

In another embodiment, an adjustable aperture may be provided as an iris-type aperture. The iris-type aperture may be controlled by a motor for accurate beam control.

In operation of an exemplary charged particle inspection system, such as by using an EBI system, pre-charging is conducted before wafer inspection. In some embodiments, the EBI system 100 can be operated in a defocused mode configured to conduct pre-charging of the wafer to be inspected. The EBI system 100 can also be operated in an imaging mode configured to conduct inspection by e-beam imaging. In both the defocused mode and the imaging mode, an electron emitter of an electron beam tool generates an electron beam.

Figure 5:
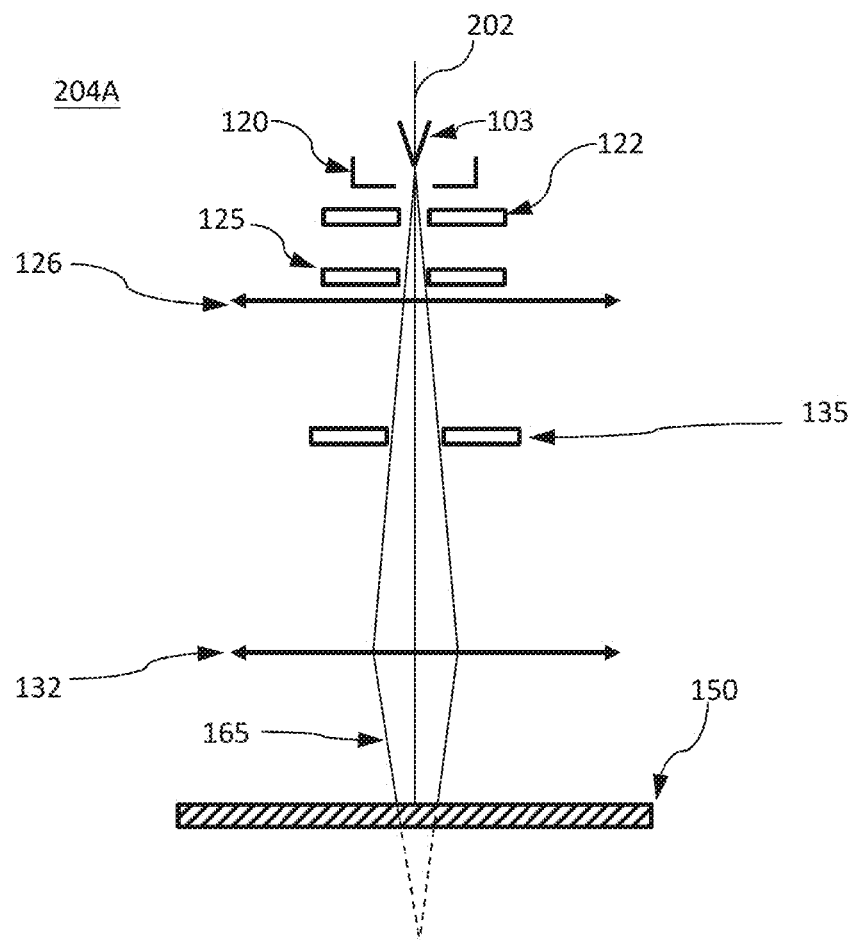
FIG. 5 is a schematic diagram illustrating an exemplary electron beam tool operating in a defocused mode, consistent with embodiments of the present disclosure.

In the defocused mode, as shown in FIG. 5, a gun aperture 122 of an electron beam tool 204A operating in the defocused mode is configured to allow an electron beam generated by the electron emitter to pass through the gun aperture 122. For example, in the defocused mode, the electron beam tool is configured to produce a defocused electron beam 165 incident on the wafer 150. The defocused electron beam 165 may be suitable for irradiating a relatively large area to be inspected on the wafer. Additional apertures, such as beam limit aperture 125 and column aperture 135, may be set to allow the defocused electron beam to pass therethrough unimpeded. The defocused electron beam 165 may be set by the apertures according to current level, such that the current of the electron beam is set to a first current level. The current level may be set collectively such that all of the gun aperture 122, the beam limit aperture 125, and the column aperture 135 affect the current level of the beam that passes through to the wafer. Alternatively, the beam current level can be substantially determined by the gun aperture 122 while other apertures are set to be large enough that they do not substantially affect the beam current. The defocused electron beam 165 may pass through the focusing optics of the electron beam tool, such as condenser lens 126 and objective lens 132, which are shown schematically in FIG. 5. However, the defocused electron beam 165 is not focused into a fine point on the surface of the wafer 150 by the electron optics. The defocused electron beam 165 is relatively defocused compared to a probe spot configured to be used for e-beam inspection, and thus the defocused electron beam is made to have a spot size that is broad. In some embodiments, defocused electron beam 165 can be scanned across a region of the wafer 150 to conduct pre-charging. In some embodiments, defocused electron beam 165 is not scanned across the wafer and instead irradiates a smaller region.

Figure 6:
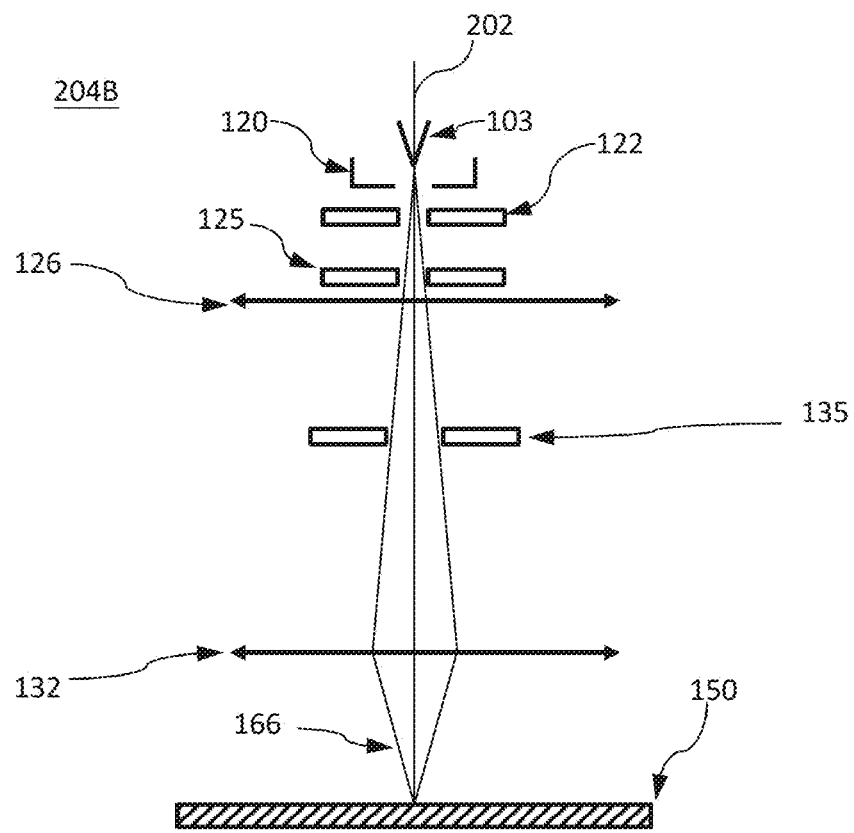
FIG. 6 is a schematic diagram illustrating an exemplary electron beam tool operating in an imaging mode, consistent with embodiments of the present disclosure.

In an imaging mode, as shown in FIG. 6, the focusing optics of an electron beam tool 204B operating in the imaging mode are controlled to focus the electron beam into a fine point for conducting imaging inspection. For example, in the imaging mode, the electron beam tool is configured to produce an inspection electron beam 166 incident on the wafer 150. The inspection electron beam can then be used for imaging by scanning the beam in a pattern (for example, a raster pattern) over the wafer 150. The inspection electron beam 166 may be set to a second current level.

The first current level may be greater than or equal to the second current level. For example, typically, a large current level is desirable for pre-charging. Since the current level used for inspection is typically small, the second current level may be smaller than the first current level. However, the first current level need not necessarily be larger than the second current level, for example in cases where large current inspection is used.

When the second current level is configured to be smaller than the first current level, the current level of the inspection electron beam in the imaging mode may be set by the apertures of the electron beam tool. For example, the gun aperture 122 can be set to allow a relatively small current of the electron beam to pass therethrough. When the selectively changeable aperture plate 122a is used as the gun aperture 122, an aperture hole smaller than that used for the defocused electron beam may be used to allow the inspection beam to be incident on the wafer. In some embodiments, the selectively changeable aperture plate 122a is controlled by a motor configured to adjust the X and Y positions of the selectively changeable aperture plate 122a so that one of the plurality of apertures holes (123a, 124a, 125a, 126a, 127a, 128a) is aligned with the optical axis of the electron emitter. The motor may be controlled by a command signal from the controller 109.

The controller 109 may control the electron beam tool to be switchable between the defocused mode and the imaging mode. In the defocused mode, the controller 109 may control the motor configured to move the selectively changeable aperture plate 122a so that the defocused electron beam is set to the first current level. In the imaging mode, the controller 109 may control the motor of the selectively changeable aperture plate 122a so that the inspection electron beam is set to the second current level.

Furthermore, the controller 109 may also control the electron optics so that the defocused electron beam is defocused in the defocused mode. For example, the condenser lens and the objective lens of the electron optics may be controlled so that the focal point of the electron beam is not coincident with the wafer surface. The electron optics may adjust the electron beam so that its focal point is beyond the plane of the wafer in the optical axis direction, thus enlarging the spot size. In the imaging mode, the controller 109 may control the electron optics so that the inspection electron beam is relatively more focused than the defocused electron beam incident on the wafer. In particular, the controller 109 may control the electron optics so that the focal point of the inspection electron beam is coincident with the wafer surface. The controller 109 may also control the electron beam tool in such a way that the defocused electron beam is specified to have a particular spot size. The spot size of the defocused electron beam may be larger than the probe spot of the inspection electron beam. Furthermore, the spot of the defocused electron beam may be more diffuse than the probe spot of the inspection electron beam.

Figure 7:
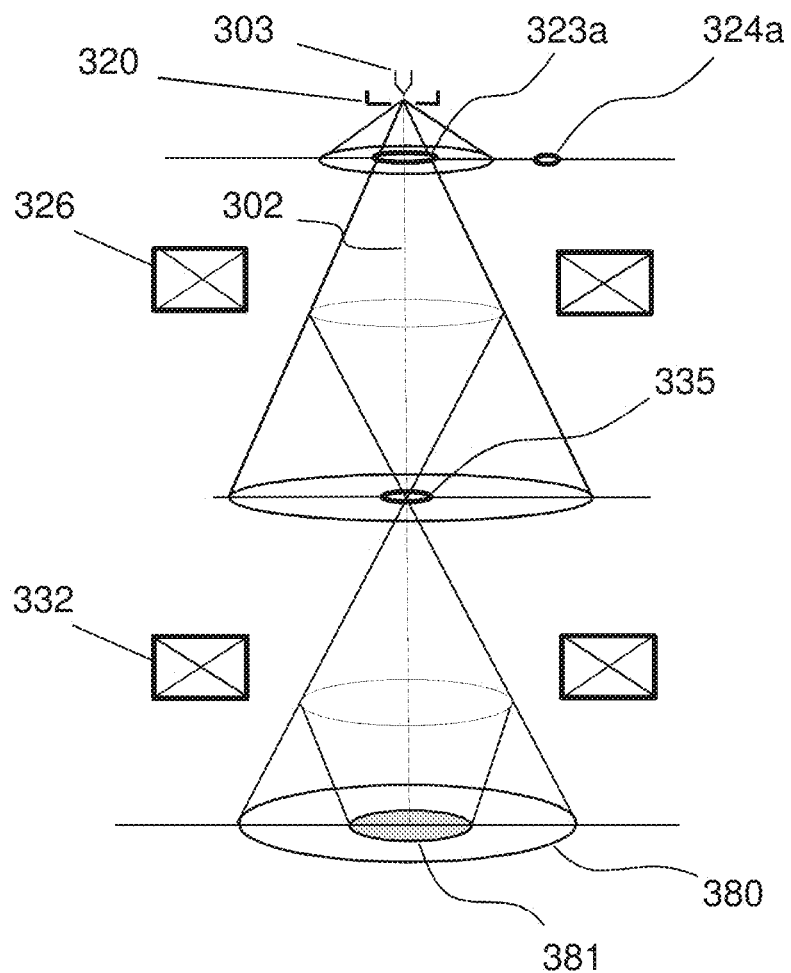
FIG. 7 is a schematic diagram illustrating an exemplary single-beam charged particle beam tool operating in a first mode, consistent with embodiments of the present disclosure.

FIG. 7 illustrates an exemplary charged particle beam tool 304A operating in a first mode, consistent with embodiments of the present disclosure. Some elements are omitted for clarity. Charged particle beam tool 304A comprises a charged particle source including a cathode 303 and an anode 320. The first mode may comprise a flooding mode. In flooding mode, a first gun aperture 323a is aligned with an optical axis 302 of the charged particle source having a size such that a beam at a first current level is allowed to pass through the first gun aperture 323a. The first current level may be relatively large, for example, 1000 nA.

The charged particle beam tool further comprises a condenser lens 326, a column aperture 335, and an objective lens 332. In the charged particle beam tool 304A operating in the first mode, condenser lens 326 is controlled to focus the 1000 nA beam at the center of column aperture 335. The 1000 nA beam may be focused such that substantially all of the charged particles passing through first gun aperture 323a pass through column aperture 335. Thus, flooding beam current incident on a sample placed below the charged particle source may be substantially the same as the first current level. The flooding mode may be achieved by focusing the beam into the center of column aperture 335 such that column aperture 335 does not limit the beam current. Since the focused beam is much smaller than the diameter of the column aperture 335, substantially all of the beam current will pass through the aperture hole and can reach the sample as flooding current.

Upon reaching the sample, the defocused beam may expand to irradiate an area of the sample comprising area 380.

The flooding mode may comprise conducting primary beam flooding of the sample placed below the charged particle source. In primary beam flooding, objective lens 332 may be controlled to focus the beam to a desired level. For example, objective lens 332 can be controlled to produce a primary beam flooding spot 381 having a desired size. The spot size can be adjusted within a range comprising area 380. Thus, the beam can be controlled to a desired level of focusing.

Objective lens 332 may be operable with a large range of defocused beam shapes/sizes which may be used in flooding mode. The size of flooding spot 381 can be adjusted up to the size of area 380 (which may be, for example, in the sub-millimeter range, such as in the vicinity of 0.5 mm) and down to nearly the size of a focused spot (which may be, for example, a few nanometers). The range of spot sizes in flooding mode may consist of any defocused spots, and may comprise a range from 0.1 µm to 500 µm in some exemplary embodiments.

Figure 8:
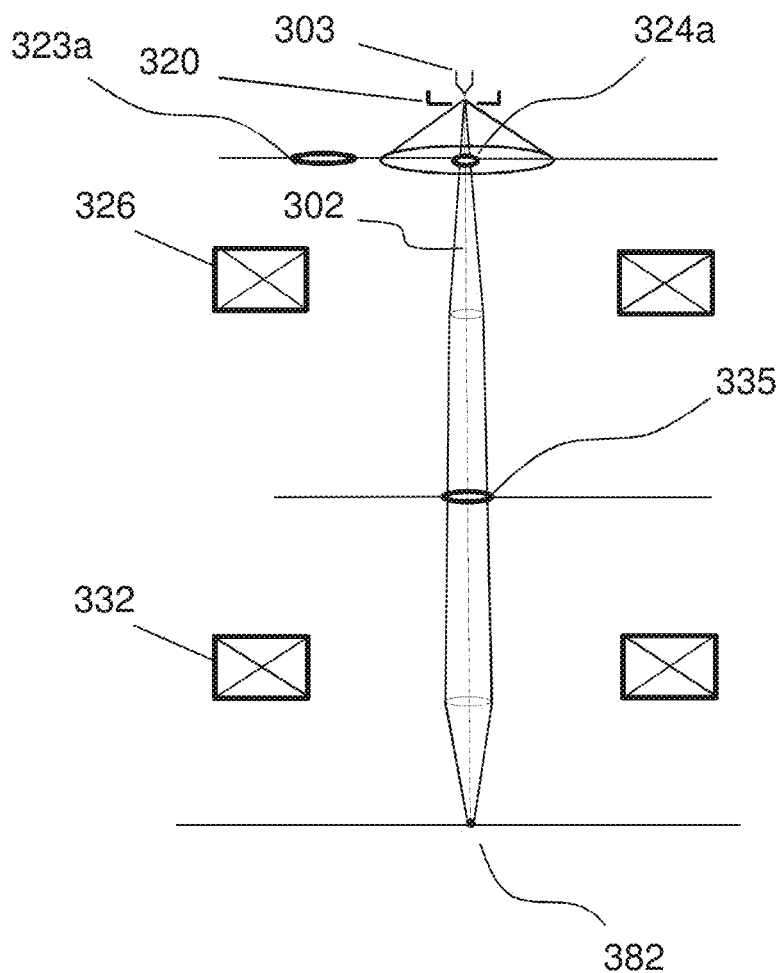
FIG. 8 is a schematic diagram illustrating an exemplary single-beam charged particle beam tool operating in a second mode, consistent with embodiments of the present disclosure.

FIG. 8 illustrates an exemplary charged particle beam tool 304B operating in a second mode, consistent with embodiments of the present disclosure. The second mode may comprise an imaging mode. In imaging mode, a second gun aperture 324a is aligned with optical axis 302 of the charged particle source such that a beam at a second current level is allowed to pass through the second gun aperture 324a. The second current level may be relatively small, for example, 20 nA.

In the charged particle beam tool 304B operating in the second mode, condenser lens 326 is controlled to focus the 20 nA beam for further precise control. Focusing may occur together with adjusting column aperture 335, or independent of column aperture 335. For example, a beam having more or less charged particles can be made to pass through column aperture 335 such that an inspection beam reaches the sample at a particular current level, such as 5 nA or 6.5 nA with precise control. Objective lens 332 is controlled to focus the inspection beam to an imaging spot size. Upon reaching the sample, the focused beam may converge at a point on the surface of the sample, thereby forming a probe spot 382. Size of probe spot 382 may be in the range of several nm, or less.

In some embodiments, the flooding electron beam may be configured to form a spot size substantially encompassing the FOV of the charged particle beam tool.

The controller 109 may control the flooding dosage when in the first mode. For example, the controller 109 may irradiate the wafer while in the first mode for a predetermined time period.

In some embodiments, the flooding process can be implemented in continuous moving mode, in which, as the flooding is turned on, the wafer is carried by motorized stage 134 moving along X and Y directions with controlled speed. The moving speed may be optimized according to the needed flooding dosage and timing. In continuous moving mode, at least one scan is made on an area of the wafer prior to the imaging scan to charge the sample positively or negatively depending on the secondary electron emission efficiency. When operating in continuous moving mode, the switching time between flooding and imaging is relatively short, since the same beam can be used both for flooding and imaging. Furthermore, the pre-charged area can be precisely controlled. In some embodiments, the small beam current of the primary electron beam for imaging may be sufficient for pre-scanning to equilibrate the state of the surface charging or detecting voltage contrast defects with low leakage rate.

The flooding process can also be implemented in "Leap and Flood" mode wherein the flooding beam is turned on for a certain period of time with a desired dosage while the motorized stage 134 carries the wafer to stop in selected positions. Conducting the flooding process in "Leap and Flood" mode may be advantageous when detecting some electrical defects having a high leakage rate, such as a thin void in copper interconnects, which require a large amount of electrons to build up charging in order to be detected.

Figure 9:
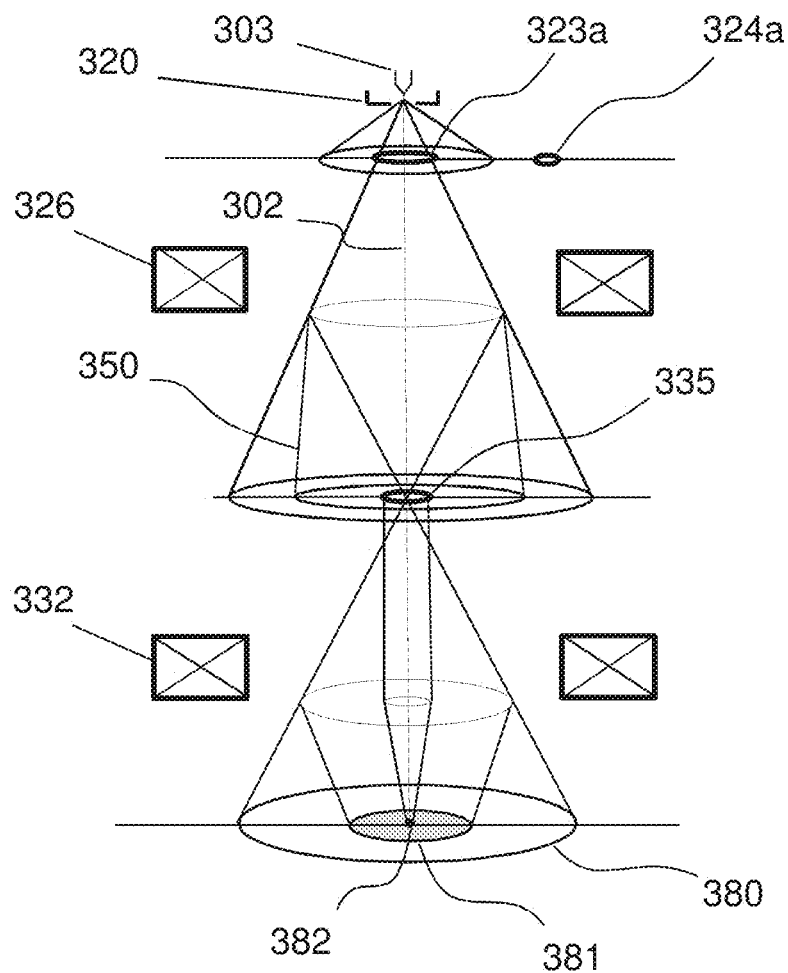
FIG. 9 is a schematic diagram illustrating an exemplary single-beam charged particle beam tool operating in a hybrid mode, consistent with embodiments of the present disclosure.

FIG. 9 illustrates an exemplary charged particle beam tool 304C operating in a hybrid mode, consistent with embodiments of the present disclosure. In hybrid mode, the charged particle beam may combine functionality of flooding and imaging modes. While the charged particle beam tool is in hybrid mode, the first gun aperture 323a is selected to be aligned with optical axis 302 of the charged particle source. For example, first gun aperture 323a may have a size configured to pass a beam of 1000 nA. Meanwhile, a column aperture having a size suitable for imaging is selected. The column aperture may be a selectively changeable aperture. The size of column aperture 335 may be smaller than that of first gun aperture 323a. For example, column aperture 335 may have a size configured to pass a beam of 5 nA.

In hybrid mode, condenser lens 326 can be controlled to produce beams suitable for both flooding and imaging. Control of condenser lens 326 may occur independently of the apertures to adjust the beam. For example, as shown in FIG. 9, condenser lens 326 can be controlled to produce an intermediate beam 350. Intermediate beam 350 is not focused to the center of column aperture 335. Thus, further control over the beam current can be achieved by using an appropriately sized column aperture to limit the beam. Intermediate beam 350, upon passing through column aperture 335 and objective lens 332 may be shaped appropriately such that the beam focuses to a point on the surface of the sample and becomes suitable for imaging. Also, condenser lens 326 can be controlled to focus the 1000 nA beam, having passed through first gun aperture 323a, to the center of column aperture 335. The 1000 nA beam may be focused such that substantially all of the charged particles passing through first gun aperture 323a pass through column aperture 335. Thus, in hybrid mode, a flooding beam can also be produced in which current incident on a sample placed below the charged particle source is substantially the same as the first current level. Upon reaching the sample, the defocused beam may expand to illuminate an area of the sample comprising area 380, and may be further focused by objective lens 332 to form primary beam flooding spot 381.

Operating in hybrid mode may enable further improvements to switching speed. Since electromagnetic lenses, such as condenser lens 326, may be controlled by electrical input signals, the time required to adjust lens conditions and thereby change a beam profile passing through the lens is extremely short. On the other hand, apertures are changed by physically moving aperture plates to align a separate aperture hole with the optical axis of the beam. In some embodiments, for example, a condenser lens may be adjusted ten times faster than an aperture.

In some embodiments, imaging quality can be affected by operating in hybrid mode. For example, when a large current beam passes through the gun aperture, a portion of the beam may be incident on the top of the column aperture. This may affect the probe beam's optical performance slightly. For example, when a very large current is used, such as 100 times the needed current for imaging, the optical performance can be sufficient for conducting imaging for inspecting wafers for defects.

In some embodiments, a relatively large gun aperture is used which allows a beam having a current level which is typically higher than that used for imaging or pre-scanning to pass through. Furthermore, the charged particle beam tool may comprise a charged particle source with a booster. A booster may be employed to boost the beam current of the tool's primary beam source to its highest levels so that the charged particle source may act like a flood gun.

In an exemplary method consistent with embodiments of the present disclosure, a sample is inspected using a charged particle beam system. The method comprises emitting a charged particle beam incident on the sample at a first current level while the beam is defocused on the surface of the sample. This emission step may be a flooding process. For example, this emission step may comprise operating EBI system 100 in a first mode configured to conduct flooding for pre-charging of the wafer to be inspected.

Figure 10:
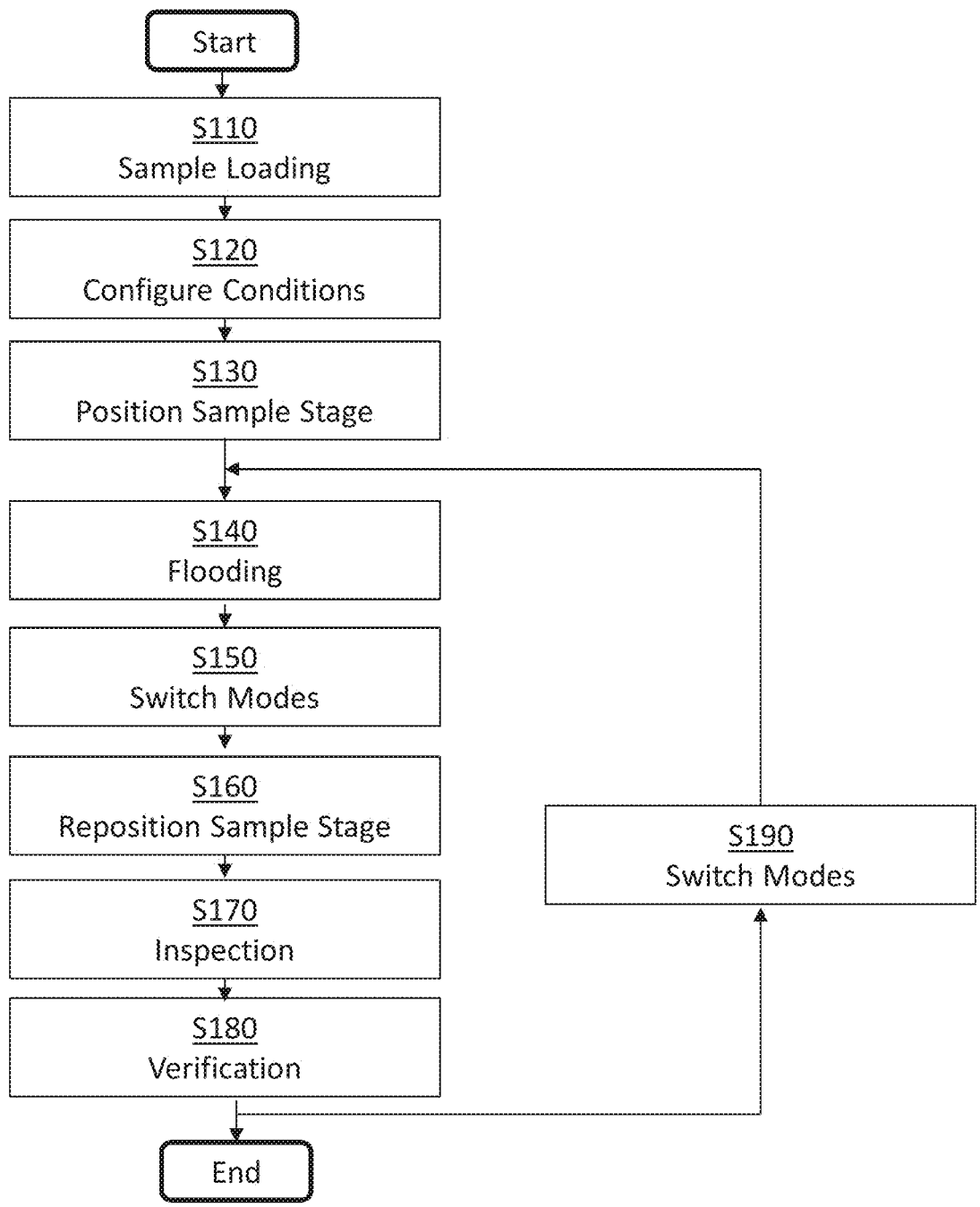
FIG. 10 is a flowchart illustrating an exemplary method for inspecting a wafer, consistent with embodiments of the present disclosure.

FIG. 10 is a flowchart illustrating an exemplary method consistent with embodiments of the present disclosure. As shown in FIG. 10, a method for inspecting a wafer begins with a step S110 of sample loading. Step S110 may comprise opening a loading port, inserting a wafer, closing the loading port, sealing a column of a charged particle beam apparatus, and drawing a vacuum.

Next, in a step S120 of configuring conditions, initial conditions for performing analysis may be set. For example, an operator may specify settings of a desired voltage, aperture, charged particle beam current level, and focus. In some embodiments, conditions may be set automatically.

Next, in a step S130 of positioning a sample stage, the wafer's X and Y positions, tilt, angular orientation, etc., can be fine-tuned. For example, a sample stage can be moved to align a desired inspection area on the wafer with the FOV of the charged particle beam apparatus.

Next, in a step S140, flooding of the wafer can be conducted. The flooding process may comprise emitting a charged particle beam incident on the wafer at a first current level while the beam is defocused on the surface of the wafer. For example, the flooding process may be conducted in the first mode, as discussed herein.

Next, in a step S150 of switching modes, conditions of the charged particle beam apparatus may be modified. For example, the aforementioned voltage, aperture, charged particle beam current level, and focus can be adjusted. However, there is no need to open the sample loading chamber, vent the vacuum, or reset the voltage level before proceeding to the next steps.

In a step S160, the sample stage can be further adjusted, if necessary.

In a step S170, inspection of the wafer can be conducted. The inspection process may comprise emitting a charged particle beam incident on the wafer at a second current level while the charged particle beam is focused on the surface of the wafer. During inspection, the charged particle beam may scan across the surface of the wafer to generate an image based on detected secondary or backscattered charged particles. For example, the inspection process may be conducted in the second mode, as discussed herein.

Next, in a step S180 of verification, the presence or absence of defects can be confirmed. The location of detected defects can be saved with an address. Additional details of the detected defect, such as type, severity, and an image of the region can also be recorded. Furthermore, a region analyzed in the inspection step S170 can be registered as being free of defects. Thereafter, additional steps may be carried out for inspecting other areas of the wafer.

After verification of an area, the method may proceed to a step S190 of switching modes in preparation for repeating steps S140 through S180. The method may be terminated at a user's command or when all desired areas have been inspected.

As described above, steps of emitting a charged particle beam may comprise operating EBI system 100 in a first mode where EBI system 100 is controlled to defocus its electron beam on a surface of wafer 150, and a second mode where EBI system 100 is controlled to focus its electron beam into a fine point for conducting imaging inspection.

The exemplary method may further comprise adjusting an adjustable aperture such that the second current level is smaller than the first current level. Adjustment of the aperture may be done by hand or by machine via a controller of the charged particle beam system.

The exemplary method may further comprise switching from the first mode to the second mode, and vice versa. In some embodiments, modes may be switched back and forth rapidly. For example, it may be desirable to switch modes frequently when an inspected structure is only able to hold a charge for a short amount of time, which may be due to current leakage or the like. In such a case, an exemplary process may comprise flooding an area (0.2 s), switching modes (0.1 s), inspecting the area (0.5 s), switching modes and moving to a new area, and so on.

When operating in hybrid mode, switching time can be further reduced, thus improving performance in conducting rapid switching.

The flowchart and block diagrams in the Figures illustrate the architecture, functionality, and operation of possible implementations of systems, methods, and computer program products according to various exemplary embodiments of the present disclosure. In this regard, each block in a flowchart or block diagram may represent a module, segment, or portion of code which comprises one or more executable instructions for implementing the specified logical functions. It should be understood that in some alternative implementations, functions indicated in the block may occur out of the order noted in the Figures. For example, two blocks shown in succession may be executed substantially concurrently, or two blocks may sometimes be executed in reverse order, depending upon the functionality involved. It should also be understood that each block of the flowcharts or block diagrams, and combination of the blocks, can be implemented by special purpose hardware-based systems that perform the specified functions or acts, or by combinations of special purpose hardware and computer instructions.

The possible implementations of systems, methods, and computer program products can be stored in an internal or external data storage. The internal/external storage may be a volatile or non-volatile, magnetic, semiconductor, tape, optical, removable, non-removable, or other type of storage device or tangible or non-transitory computer-readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same, such as cloud storage.

Exemplary embodiments of the present disclosure may achieve certain superior advantages over a traditional flood gun flooding process including the following. For example, fast switching is possible from flooding mode to imaging/inspection mode and vice versa. In a typical process using a discrete flood gun, switching to an imaging mode may require several minutes. However, in exemplary embodiments, switching time may be reduced to a matter of seconds, if not less than a second. Thus, one to two orders of magnitude of machine time savings can be achieved.

An advantage of shorter switching time is the reduced waiting time (after flooding to start inspection). Inspection sensitivity can be improved by reducing the amount of leaked charge due to waiting time. Since certain types of applications are sensitive to the waiting/delaying time, and the e-beam flooding generated charging conditions may not last long before they released (leaked), dramatic switching time savings help cover more usable applications. Additionally, time savings is advantageous for improving throughput.

Compared to a traditional flood gun, the primary beam source of a charged particle beam system, such as an SEM column, has much more sophisticated native electron optics capabilities and controllability, which enables major advantages by taking advantage of these capabilities to generate the needed beam current density, dosage, field potentials, and so on, within precisely controllable levels. For example, various energy level setting may be used. In some embodiments, the primary beam source which is used both for flooding and imaging is operable in a range of 100 eV to 3000 eV. Within this range, an energy level of, for example, 199 eV or 1777 eV may be precisely selected. Values can be selected for individually optimizing the desired process, such as flooding or imaging.

The use of multiple apertures allows for precise control of the target current to be passed through the aperture and proceed to the sample. The target current may be controlled depending on the application and desired process, such as flooding or inspection. In some embodiments, an inspection function may be carried out using the same aperture used for flooding. In some embodiments, the same aperture used for flooding and imaging may be the smallest aperture provided in the e-beam inspection tool.

Furthermore, in some cases, the first mode and the second mode can share a single gun aperture to first satisfy current requirements for flooding, then the beam current can be reduced to a level suitable for inspection by combining usage of the condenser lens, objective lens, and column apertures.

Neutralization is one application of pre-charging control. In some embodiments, flooding is carried out to pre-set the charge of the wafer surface to a certain level before e-beam inspection. In some embodiments, the surface charge of the wafer is neutralized so as to remove the effect of certain previous operations, which may have left an undesired charge on the wafer. According to various flooding conditions, operating parameters of the e-beam source can be flexibly selected.

Flooding efficiency may be improved according to exemplary embodiments. For example, a traditional flood gun may be capable of emitting higher current such as hundreds of micro-amps, but due to its bigger beam spot size (for example, over 10 mm), it cannot flood a smaller area without over flooding unnecessary areas. For e-beam inspection machines, an area over 10 to 100 times larger than the area of interest may be flooded unnecessarily due to the oversized beam spot or inaccurate positions or unevenness of the beam density. With a flooding method conducted by an e-beam inspection tool's primary beam source according to some exemplary embodiments, flooding can be accurately limited to the areas to be inspected. Thus, increased accuracy may save time for inspection applications using the partial wafer or for small area flooding.

Furthermore, cost savings may be achieved compared to a traditional flood gun having a dedicated controller or power supply. For example, exemplary embodiments may eliminate the need for redundant systems such as separate controllers and a power supply for a dedicated flood gun.

In exemplary embodiments, a charged particle beam source configured to operate in two modes can share a single controller for the two functions of flooding and inspection.

Thus, a system having a dual mode charged particle source can omit unnecessary components including a separate dedicated use flood gun and its related accessories, such as its controller and the like.

The embodiments may further be described using the following clauses:

1. A charged particle beam system comprising:
   a charged particle source configured to emit a charged particle beam along an optical axis;
   at least one aperture configured to allow the charged particle beam to pass therethrough; and
   a controller configured to:
   control the charged particle beam system to emit the charged particle beam in a first mode in which the charged particle beam is incident on a sample at a first current level and the charged particle beam incident on the sample is defocused;
   control the charged particle beam system to emit the charged particle beam in a second mode in which the charged particle beam is incident on the sample at a second current level and the charged particle beam incident on the sample is focused to a surface of the sample; and
   switch the charged particle beam system between the first mode and the second mode.
2. The charged particle beam system of clause 1, wherein the controller is further configured to:
   form a first spot on the surface of the sample in the first mode; and
   form a second spot on the surface of the sample in the second mode.
3. The charged particle beam system of clause 1, wherein the first current level is greater than or equal to the second current level.
4. The charged particle beam system of clause 1, wherein the first current level is larger than the second current level.
5. The charged particle beam system of clause 2, wherein the first spot is more defocused than the second spot.
6. The charged particle beam system of clause 2, wherein the controller is further configured to:
   form the first spot having a first spot size, and
   form the second spot having a second spot size, wherein the first spot size is larger than the second spot size.
7. The charged particle beam system of clause 1, wherein the controller is further configured to:
   perform charged particle flooding of the surface of the sample in the first mode; and
   perform charged particle beam inspection of the sample in the second mode.
8. The charged particle beam system of clause 1, further comprising:
   an aperture plate having a first aperture and a second aperture formed thereon, wherein the first aperture has a size larger than that of the second aperture; and
   a motor configured to adjust a position of the aperture plate;
   wherein the controller is configured to:
   move the aperture plate so that the first aperture is aligned with the optical axis in the first mode, and
   move the aperture plate so that the second aperture is aligned with the optical axis in the second mode.
9. The charged particle beam system of clause 1, wherein the charged particle beam system is a scanning electron microscope and the charged particle beam is an electron beam.
10. A method of inspecting a sample using a charged particle beam system, the method comprising:
    emitting a charged particle beam incident on the sample at a first current level, the charged particle beam being defocused on a surface of the sample; and
    emitting a charged particle beam incident on the sample at a second current level, the charged particle beam being focused on the surface of the sample.
11. The method of clause 10, further comprising:
    adjusting an adjustable aperture such that the second current level is smaller than the first current level.
12. The method of clause 10, further comprising:
    performing charged particle flooding of the surface of the sample; and
    performing charged particle beam inspection of the sample.
13. The method of clause 10, further comprising:
    forming a first spot on a surface of the sample at the first current level; and
    forming a second spot on the surface of the sample at the second current level.
14. The method of clause 10, wherein the second current level is smaller than the first current level.
15. The method of clause 13, wherein the second spot is smaller than the first spot.
16. A non-transitory computer readable medium storing a set of instructions that is executable by one or more processors of a charged particle system to cause the charged particle system to perform a method comprising:
    instructing a charged particle emitter to emit a charged particle beam in a first mode in which the charged particle beam is incident on a sample at a first current level and the charged particle beam incident on the sample is defocused;
    instructing the charged particle system to switch between the first mode and a second mode;
    instructing the charged particle emitter to emit a charged particle beam in the second mode in which the charged particle beam is incident on the sample at a second current level and the charged particle beam incident on the sample is focused to a surface of the sample.
17. The computer readable medium of clause 16, wherein the set of instructions that is executable by the one or more processors of the charged particle system is configured to cause the charged particle system to further perform:
    instructing an electromagnetic lens to focus the electron beam in the first mode to form a first spot on the surface of the sample; and
    instructing the electromagnetic lens to focus the electron beam in the second mode to form a second spot on the surface of the sample.
18. The computer readable medium of clause 16, wherein the set of instructions that is executable by the one or more processors of the charged particle system is configured to cause the charged particle system to further perform:
    changing an aperture from a first aperture hole configured to allow the charged particle beam in the first mode to pass therethrough to a second aperture hole configured to allow the charged particle beam in the second mode to pass therethrough.
19. The computer readable medium of clause 16, wherein the first current level is greater than or equal to the second current level.
20. The computer readable medium of clause 16, wherein the first current level is larger than the second current level.
21. The computer readable medium of clause 17, wherein the first spot is more defocused than the second spot.

22. The computer readable medium of clause 17, wherein the set of instructions that is executable by the one or more processors of the charged particle system is configured to cause the charged particle system to further perform:

forming the first spot having a first spot size, and forming the second spot having a second spot size, wherein the first spot size is larger than the second spot size.

23. The computer readable medium of clause 16, wherein the set of instructions that is executable by the one or more processors of the charged particle system is configured to cause the charged particle system to further perform:

charged-particle flooding of the surface of the sample in the first mode; and charged-particle inspecting of the sample in the second mode.

24. A charged particle beam system comprising:

a charged particle source configured to emit a charged particle beam along an optical axis;

at least one aperture configured to allow the charged particle beam to pass therethrough;

at least one electromagnetic lens configured to control focusing of the charged particle beam; and a controller configured to:

control the charged particle beam system to emit the charged particle beam in a flooding mode;

control the charged particle beam system to emit the charged particle beam in a scanning mode; and switch the charged particle beam system between the flooding mode and the scanning mode.

25. The charged particle beam system of clause 24, wherein the at least one aperture is set to a first aperture hole in the first mode and the second mode; and the at least one electromagnetic lens changes a focal point of the charged particle beam between the flooding mode and the scanning mode.

26. The charged particle beam system of clause 24, wherein the charged particle source is a primary beam of a charged particle beam tool.

It will be appreciated that the present invention is not limited to the exact constructions that have been described above and illustrated in the accompanying drawings, and that various modifications and changes can be made without departing from the scope thereof. Furthermore, the above exemplary embodiments are not necessarily mutually exclusive and may be combined with one another. For example, continuous moving mode may be implemented even when changing apertures between the first mode and the second mode. Moreover, an aperture may comprise a circular hole, a slit, or any shape suitable for allowing a beam to pass therethrough.

It is intended that the scope of the invention should only be limited by the appended claims.

The invention claimed is:

1. A charged particle beam system comprising:

a charged particle source configured to emit a charged particle beam along an optical axis;

an adjustable aperture configured to allow the charged particle beam to pass therethrough, the adjustable aperture being changeable to provide a selected aperture size; and a controller configured to:

control the charged particle beam system to emit the charged particle beam in a first mode in which the charged particle beam passes through the adjustable aperture at a first aperture size and is incident on a sample at a first current level and the charged particle beam incident on the sample is defocused so as to flood a region on a surface of the sample with charged particles of the charged particle beam;

control the charged particle beam system to emit the charged particle beam in a second mode in which the charged particle beam passes through the adjustable aperture at a second aperture size and is incident on the sample at a second current level and the charged particle beam incident on the sample is focused to the surface of the sample; and switch the charged particle beam system between the first mode and the second mode.

2. The charged particle beam system of claim 1, wherein the controller is further configured to:

form a first spot on the surface of the sample in the first mode; and form a second spot on the surface of the sample in the second mode, wherein a spot size of the first spot is different from the second spot.

3. The charged particle beam system of claim 1, wherein the first current level is greater than or equal to the second current level.

4. The charged particle beam system of claim 1, wherein the first current level is larger than the second current level.

5. The charged particle beam system of claim 2, wherein the first spot is more defocused than the second spot.

6. The charged particle beam system of claim 2, wherein the controller is further configured to:

form the first spot having a first spot size, and form the second spot having a second spot size, wherein the first spot size is larger than the second spot size.

7. The charged particle beam system of claim 1, wherein the controller is further configured to:

perform charged particle beam inspection of the sample in the second mode.

8. The charged particle beam system of claim 1, further comprising:

an aperture plate having a first aperture and a second aperture formed thereon, wherein the first aperture has a size larger than that of the second aperture; and a motor configured to adjust a position of the aperture plate;

wherein the controller is configured to:

move the aperture plate so that the first aperture is aligned with the optical axis in the first mode, and move the aperture plate so that the second aperture is aligned with the optical axis in the second mode.

9. The charged particle beam system of claim 1, wherein the charged particle beam system is a scanning electron microscope and the charged particle beam is an electron beam.

10. A method of inspecting a sample using a charged particle beam system, the method comprising:

emitting a charged particle beam through an adjustable aperture plate at a first aperture size so that the charged particle beam is incident on the sample at a first current level, the charged particle beam being defocused on a surface of the sample so as to flood a region on the surface of the sample with charged particles of the charged particle beam; and emitting a charged particle beam through the adjustable aperture plate at a second aperture size so that the charged particle beam is incident on the sample at a second current level, the charged particle beam being focused on the surface of the sample.

11. The method of claim 10, further comprising:
adjusting the adjustable aperture such that the second current level is smaller than the first current level.

12. The method of claim 10, further comprising:
performing charged particle beam inspection of the sample.

13. The method of claim 10, further comprising:
forming a first spot on a surface of the sample at the first current level; and
forming a second spot on the surface of the sample at the second current level, wherein a spot size of the first spot is different from the second spot.

14. The method of claim 10, wherein the second current level is smaller than the first current level.

15. The method of claim 13, wherein the second spot is smaller than the first spot.

16. The charged particle beam system of claim 1, further comprising a column aperture, wherein the controller is configured to focus the charged particle beam in a region of the column aperture in the first mode.

17. The charged particle beam system of claim 16, wherein the controller is configured to project the charged particle beam on the column aperture in the second mode.

18. The method of claim 10, further comprising focusing the charged particle beam in a region of a column aperture while performing charged particle flooding.

19. The method of claim 18, further comprising projecting the charged particle beam on the column aperture.

* * * * *